United States Patent [19]

Yokotsuka et al.

[11] Patent Number: 5,124,995
[45] Date of Patent: Jun. 23, 1992

[54] SEMICONDUCTOR LIGHT-EMITTING DEVICE

[75] Inventors: Tatsuo Yokotsuka, Kawasaki; Akira Takamori, Atsugi, both of Japan

[73] Assignee: Matsushita Electric Industrial Co., Ltd., Osaka, Japan

[21] Appl. No.: 667,989

[22] Filed: Mar. 12, 1991

[30] Foreign Application Priority Data

| Mar. 15, 1990 | [JP] | Japan | 2-64652 |
| Mar. 15, 1990 | [JP] | Japan | 2-64653 |
| Mar. 15, 1990 | [JP] | Japan | 2-64654 |

[51] Int. Cl.⁵ .............................................. H01S 3/19
[52] U.S. Cl. ........................................ 372/45; 357/17
[58] Field of Search ................... 372/45, 46; 357/17

[56] References Cited

U.S. PATENT DOCUMENTS 4,893,313 1/1990 Hatakoshi ............................ 372/46
4,974,231 11/1990 Gomyo ................................ 372/45

FOREIGN PATENT DOCUMENTS 63-197391 8/1988 Japan.

Primary Examiner—Georgia Y. Epps
Attorney, Agent, or Firm—Lowe, Price, LeBlanc & Becker

[57] ABSTRACT

A semiconductor light-emitting device comprising a substrate formed of GaAs, a cladding layer formed of $(Al_xGa_{1-x})_yIn_{1-y}P$ and an active layer formed of $Ga_yIn_{1-y}P$ ($0.5 \leq y \leq 1$) or $Ga_yIn_{1-y}P$ ($0 \leq y \leq 0.5$), said cladding layer having its composition represented by $(Al_xGa_{1-x})_{0.5}In_{0.5}P$ ($0 \leq x \leq 1$), lattice-matched to said GaAs substrate, and said cladding layer having a band-gap size made larger by at least 0.25 eV than said active layer. The device can attain an oscillation wavelength of 0.67 μm or less or from 0.68 μm to 0.78 μm.

5 Claims, 4 Drawing Sheets

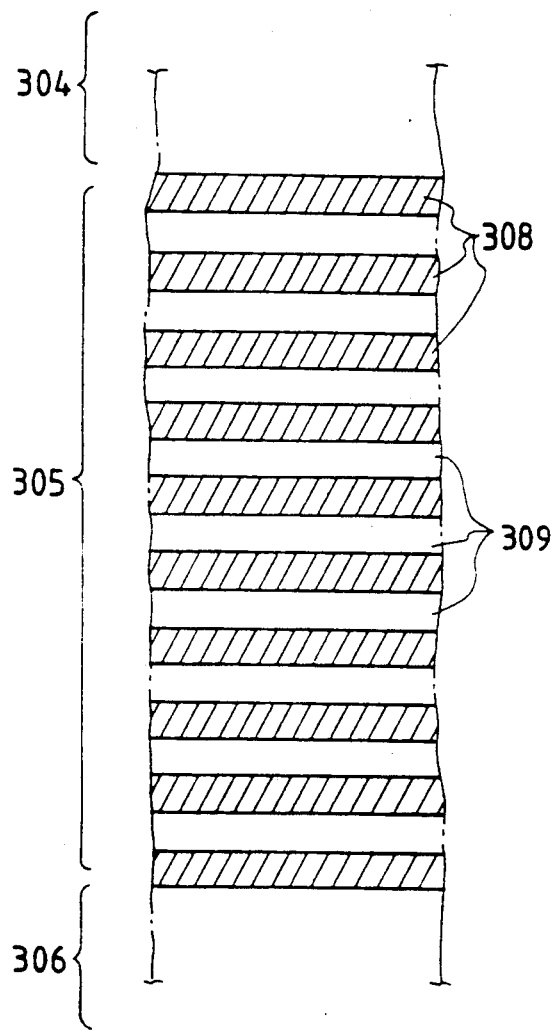
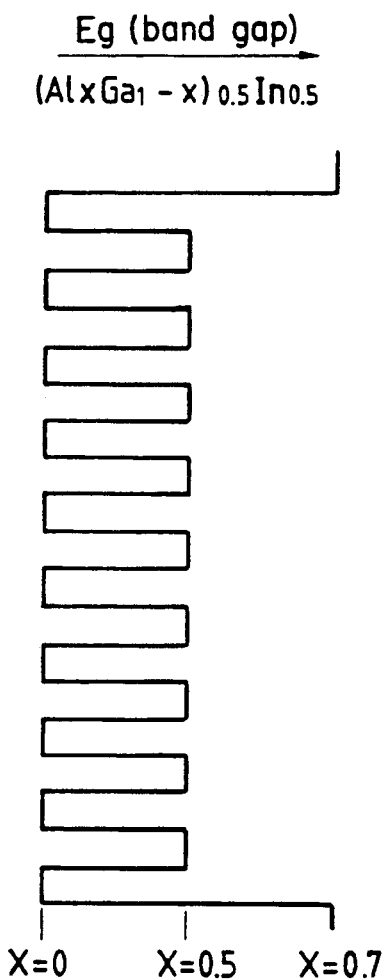
FIG. 6A PRIOR ART
FIG. 6B PRIOR ART

SEMICONDUCTOR LIGHT-EMITTING DEVICE

BACKGROUND OF THE INVENTION

1. Field of the Invention

This invention relates to a semiconductor light-emitting device used as a semiconductor laser.

2. Description of the Prior Art

As well known, wavelengths of semiconductor lasers widely used as light-sources for emitting coherent light depend on the materials that constitute the semiconductors used therein. Since, however, the oscillation wavelengths obtained have a descrete distribution through-out the infrared to visible regions, some of conventional semiconductor lasers have wavelength regions that have not been made actually attainable.

Detailed studies on the laser wavelengths having been attained by semiconductor lasers have revealed that semiconductor lasers having been put into practical use, in particular, semiconductor lasers comprised of an InP substrate and also an InGaAs material can be used in the bands of 1.3 $\mu$m and 1.55 $\mu$m; semiconductor lasers comprised of a GaAs substrate and also an AlGaAs material, in the band of 0.8 $\mu$m; and semiconductor lasers comprised of a GaAs substrate and also an AlGaInP material, in the band of 0.6 $\mu$m. In these semiconductor lasers, it is expected that changes made in the composition of a light-emitting portion, i.e., an active layer, while making a lattice match enable a change in an oscillation wavelength within the range of from 1.2 $\mu$m to 1.6 $\mu$m with regard to the InGaAs semiconductor lasers; within the range of from 0.78 $\mu$m to 0.85 $\mu$m with regard to the AlGaAs semiconductor lasers; and within the range of from 0.58 $\mu$m to 0.67 $\mu$m with regard to the AlGaInP semiconductor lasers, respectively. Material semiconductor lasers comprised of a GaSb substrate can effect oscillation in the wavelength region on the side longer than 1.6 $\mu$m, and semiconductor lasers comprised of any of II to VI group materials, in the visible region. None of the material semiconductor lasers described above, however, can effect oscillation in the wavelength region of from 0.85 $\mu$m to 1.1 $\mu$m.

In further examples, AlGaAs semiconductor lasers can effect oscillation in the wavelength region of from 0.68 $\mu$m to 0.78 $\mu$m. The semiconductor lasers of this type, however, have no good device characteristics such that they have high threshold values and low reliability.

In regard to the wavelength region of from 0.85 $\mu$m to 1.1 $\mu$m, a development has been recently made on strained lattice lasers comprised of an active layer formed of $In_yGa_{1-x}As$, which has enabled oscillation in this wavelength region. In the case of a heterostructure device, which is one of the strained lattice lasers, the device is required to have a lattice mismatch of not more than $10^{-3}$ to a substrate. In particular, in the case when it is constituted as a semiconductor laser, a defect may be introduced in its interior or no good heterointerface may be obtained if it has a large lattice mismatch, like the case of the semiconductor lasers of an InGaAs type. Hence, its crystals may undergo deterioration because of the heat generated when the device is operated, bringing about the problem in the reliability as a laser. The semiconductor lasers of his type can only have lifetimes and threshold values that are on the same level as those of the conventional semiconductor lasers of the AlGaAs type.

Stated additionally, the AlGaAs semiconductor lasers can attain an oscillation wavelength of about 0.7 $\mu$m. However, because of an increase in the compositional proportion of aluminum in the composition of the active layer, a problem arises such that the active layer undergoes oxidation in the course of operation, resulting in a very short lifetime. Namely, the increase in the aluminum component in the active layer brings about the problems that the transition probability decreases, the light absorbance increases and the n-type doping becomes difficult because of a DX center. This makes the oscillation itself difficult to operate, and hence it has been difficult to put into practical use any semiconductor lasers having oscillation wavelengths of 0.78 $\mu$m or less.

In particular, the AlGaInP semiconductor lasers (semiconductor light-emitting devices) can obtain laser light with the wavelength region of from 0.58 $\mu$m to 0.67 $\mu$m in theory. In such semiconductor lasers, band gaps become larger with an increase in the aluminum component in the active layer to tend to result in short oscillation wavelengths. Thus, as well known, an active layer of quantum well structure is used in order to improve laser characteristics, e.g., to make shorter the wavelength of oscillating laser light and to improve characteristic temperature ($T_0$).

To more specifically discuss the active layer of quantum well structure, FIG. 5 illustrates the construction of a conventional AlGaInP semiconductor laser comprising an active layer having multiple quantum well (MQW) structure of an oxide film stripe type. In the drawing, the numeral 201 denotes a p-type electrode; 202, an insulating layer; 203, a p-GaAs ohmic contact layer; 204, a p-AlGaIn cladding layer; 205, an active layer; 206, an n-AlGaIn cladding layer; 207, a GaAs substrate; and 208, an n-type electrode. As shown in FIGS. 6A and 6B as partial enlarged views, the active layer 305 of the semiconductor laser is comprised of a well layer 308 made to have the quantum well structure and a barrier layer 309. These layers have, for example, the following composition and thickness.

Well layer:
  Composition: $Ga_{0.5}In_{0.5}P$
  Thickness: 10 nm
Barrier layer:
  Composition: $(Al_{0.5}Ga_{0.5})_{0.5}In_{0.5}P$
  Thickness: 5 nm Incidentally, such a semiconductor laser can obtain a laser beam with an oscillation wavelength of 0.655 $\mu$m. The oscillation wavelength of this laser beam, however, becomes shorter by about 15 nm compared with a case when the active layer is merely comprised of $Ga_{0.5}In_{0.5}P$.

On the other hand, in this conventional semiconductor laser, an increase in the aluminum component in the active layer brings about an increase in oscillation threshold values or tends to cause oxidation of the active layer because of a high temperature at the time of operation, resulting in deterioration of laser characteristics and a short lifetime, as previously pointed out. In other words, in this conventional semiconductor laser discussed in the above, aluminum enters into the barrier layer when the active layer takes the quantum well structure, so that the aluminum in the barrier layer undergoes oxidation because of the high temperature at the time of operation to cause deterioration of the various characteristics previously noted.

SUMMARY OF THE INVENTION

Taking account of the problems in the conventional semiconductor lasers or semiconductor light-emitting devices, an object of the present invention is to provide a semiconductor laser or a semiconductor light-emitting device of an AlGaInP type, that may cause no deterioration of laser characteristics due to he oxidation of active layers or may bring about no shortening of lifetimes.

Another object of the present invention is to provide a semiconductor laser having an oscillation wavelength of from 0.68 μm to 0.78 μm and yet having a long lifetime and readily capable of being put into practical use.

The above objects of the present invention can be achieved by a semiconductor light-emitting device of the present invention described below.

According to a first embodiment of the present invention, the semiconductor light-emitting device comprises a substrate formed of GaAs, a cladding layer formed of $(Al_xGa_{1-x})_yIn_{1-y}P$ and an active layer formed of $Ga_yIn_{1-y}P$ ($0.5 \leq y \leq 1$), said cladding layer having its composition represented by $(Al_xGa_{1-x})_{0.5}In_{0.5}P$ ($0 \leq x \leq 1$), lattice-matched to said GaAs substrate, and said cladding layer having a band-gap size made larger by at least 0.25 eV than said active layer.

The above constitution according to the first embodiment of the present invention makes it possible to obtain a laser beam with an oscillation wavelength shorter than 0.67 μm, using an active layer containing no aluminum, and also to obtain a semiconductor light-emitting device having a long lifetime because of less oxidation of the active layer.

According to a second embodiment of the present invention, the semiconductor light-emitting device comprises a substrate formed of GaAs, a cladding layer formed of $(Al_xGa_{1-x})_yIn_{1-y}P$ and an active layer formed of $Ga_yIn_{1-y}P$ ($0 \leq y \leq 0.5$), said cladding layer having its composition represented by $(Al_xGa_{1-x})_{0.5}In_{0.5}P$ ($0 \leq x \leq 1$), lattice-matched to said GaAs substrate, and said cladding layer having a band-gap size made larger by at least 0.25 eV than said active layer.

The above constitution according to the second embodiment of the present invention makes it possible to put into practical use a semiconductor laser having an oscillation wavelength of from 0.68 μm to 0.78 μm and capable of being readily manufactured.

BRIEF DESCRIPTION OF THE DRAWINGS

FIG. 6A is a partial enlarged view to show an active layer of a semiconductor light-emitting device of the prior art, and FIG. 6B is a view to show a band-gap level of the active layer thereof.

DESCRIPTION OF THE PREFERRED EMBODIMENTS

The present invention will be described below in detail with reference to the accompanying drawings.

EXAMPLE 1

Figure 1A:
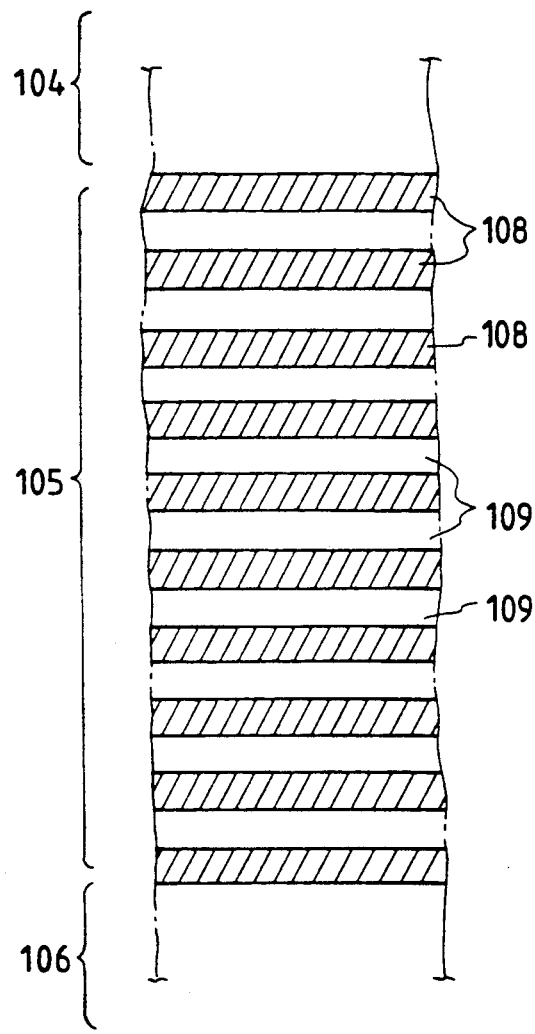
FIG. 1A is a partial enlarged view to show a GaInP active layer of a semiconductor light-emitting device according the first embodiment of the present invention.
Figure 2:
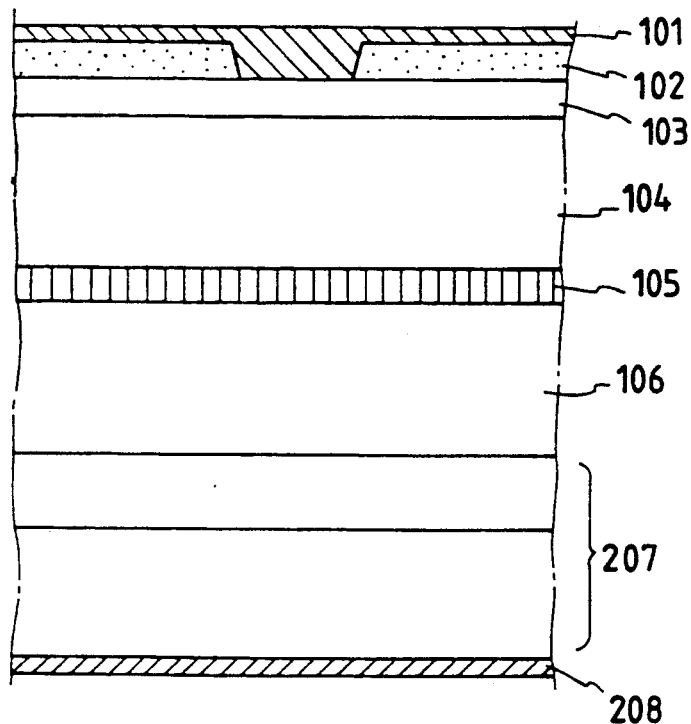
FIG. 2 is a partial cross-sectional view to show the construction of the above semiconductor light-emitting device.

FIG. 2 cross-sectionally illustrates the construction of a semiconductor laser according to the first embodiment of the present invention, having the multiple quantum well (MQW) structure of an oxide film stripe type. In FIG. 2, the numeral 101 denotes a p-type electrode: 102, an insulating layer; 103, a p-GaAs ohmic contact layer; 104, a p-AlGaInP cladding layer; 105, an GaInP active layer of $Ga_yIn_{1-y}P$ ($0.5 \leq y \leq 1$); 106, an n-AlGaInP cladding layer; 207, a GaAs substrate; and 208, an n-type electrode. As shown in FIGS. 1A as a partially enlarged view, the above GaInP active layer 105 has a strained lattice structure formed of $Ga_yIn_{1-y}P$ ($0.5 \leq y \leq 1$), and is comprised of a plurality of $Ga_{0.5}In_{0.5}P$ well layers 108, and $Ga_{0.6}In_{0.4}P$ barrier layers 109 having a larger gallium component than these $Ga_{0.5}In_{0.5}P$ well layers 108. In the example shown in the drawing, these layers respectively have the following composition and thickness.

Well layer 108:
  Composition: $Ga_{0.5}In_{0.5}P$
  Thickness: 10 nm
Barrier layer 109:
  Composition: $Ga_{0.6}In_{0.4}P$
  Thickness: 5 nm The above p-AlGaInP cladding layer 104 is so composed as to be lattice-matched to the GaAs substrate 107. As shown in FIG. 1A, this p-AlGaInP cladding layer 104 has a band-gap size made larger by 0.25 eV than the GaInP active layer 105.

Figure 1B:
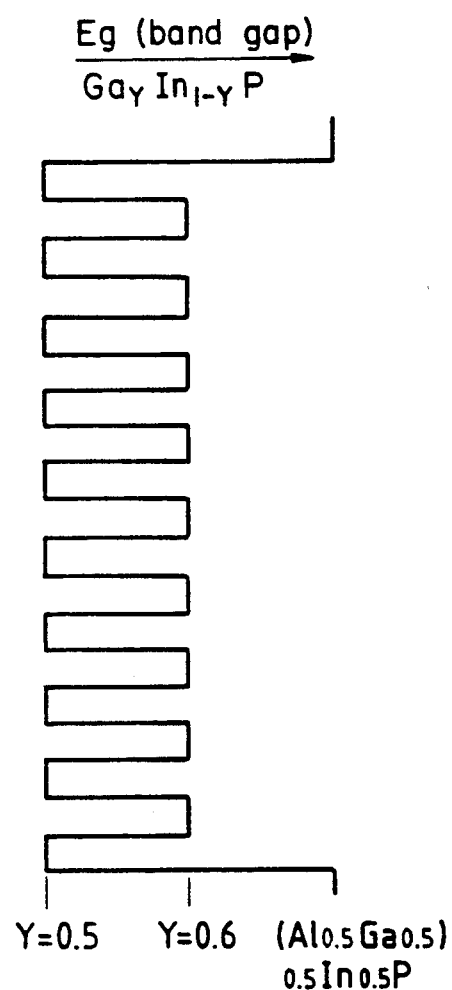
FIG. 1B is a view to show a band-gap level of the GaInP active layer.

As shown in FIG. 1B, the active layer is formed in such a way that the compositional proportion y in the composition $Ga_yIn_{1-y}P$ is periodically changed in the direction perpendicular to the surface of said substrate.

The semiconductor laser according to the present embodiment was prepared to measure oscillated laser beams. As a result, it was possible to obtain an oscillation wavelength of 650 nm (0.650 μm) which was much shorter than the oscillation wavelength 0.655 μm obtainable by a conventional semiconductor laser having a cladding layer containing aluminum. The power consumption required therefor was smaller than that in the conventional semiconductor laser, and also the laser light obtained was confirmed to be very close to coherent light. A high-temperature durability test was also carried out on the semiconductor laser to have confirmed that there was seen little change in laser characteristics from initial ones even after the test carried out over a period of about 1 month. This was concluded to be due to no occurrence of the oxidation of the active layer.

EXAMPLE 2

Figure 3:
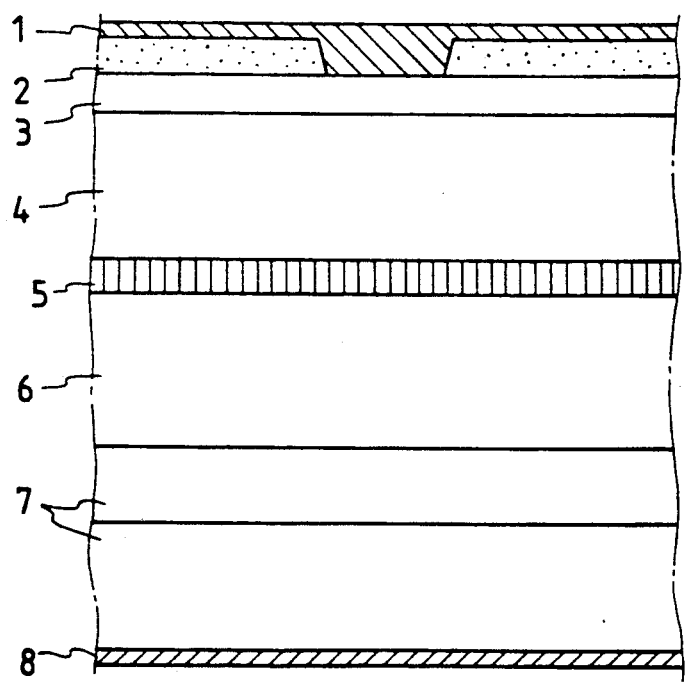
FIG. 3 is a partial cross-sectional view to show the construction of a semiconductor light-emitting device according to the second embodiment of the present invention.

FIG. 3 cross-sectionally illustrates the construction of a semiconductor laser according to the second embodiment of the present invention, having a double hetero(DH-)structure of an oxide film stripe type. In the example shown in the drawing, an active layer employs the strained lattice structure. In FIG. 3, the numeral 1 denotes a p-type electrode; 2, an insulating layer; 3, a p-GaAs ohmic contact layer; 4, a p-AlGaInP cladding layer; 5, an undoped GaInP active layer formed of $Ga_yIn_{1-y}P$ ($0 \leq y \leq 0.5$); 6, an n-AlGaInP cladding layer; 7, a GaAs substrate; and 8, an n-type electrode.

The above AlGaInP cladding layers 4 and 6 are so composed as to be lattice-matched to the GaAs substrate 7. The AlGaInP active layer 5 is so composed as to be $Ga_yIn_{1-y}P$ ($0 \leq y \leq 0.5$), having a larger indium component than the lattice-matched composition "$Ga_{0.5}In_{0.5}P$". Lattice mismatch ($\Delta a/a$) in this instance can be calculated according to the following expression:

$$\Delta a/a = (3.80 - 7.38y)/100$$

Band-gap energy (Eg) that determines the oscillation wavelength can also be calculated according to the following expression:

$$Eg\ (eV) = 1.351 + 0.643y + 0.786y^2$$

(wherein $y < 0.73$)
For example, in the case of a semiconductor laser with an oscillation wavelength of 0.73 μm, the compositional proportion y is 0.32, the corresponding band-gap energy is 1.70 eV, and the lattice mismatch is $1.4 \times 10^{-2}$.

In a semiconductor laser having an $In_xGa_{1-x}As$ cladding layer, a laser beam can be oscillated at a low threshold value even when the lattice mismatch to the GaAs substrate 7 is $2.1 \times 10^{-2}$ ($x = 0.3$). Accordingly, this principle has been applied to the $Ga_yIn_{1-y}P$ ($0 \leq y \leq 0.5$) active layer 5 in the semiconductor laser having the $(Al_xGa_{1-x})_yIn_{1-y}P$ cladding layer. Namely, it is possible to obtain a semiconductor laser with an oscillation wavelength $\lambda = 0.805$ μm when y is 0.23 and band-gap energy Eg is 1.54 eV.

Since the semiconductor laser according to the present embodiment is constituted as described above, an oscillation wavelength of from 0.68 μm to 0.78 μm can be obtained by controlling the lattice mismatch of the GaInP active layer 5 to the GaAs substrate 7 and also controlling the band-gap energy. In addition, the cladding layers 4 and 6 of this semiconductor laser are lattice-matched to the GaAs substrate 7 and also the GaInP active layer 5 can be formed using an undoped material, so that the manufacture can be made with ease.

The above embodiment shows an example in which the semiconductor laser is provided with no buffer layer. In the case when the buffer layer is provided, a structure lattice-matched to the GaAs substrate should be also employed in such a buffer layer.

EXAMPLE 3

Figure 4:
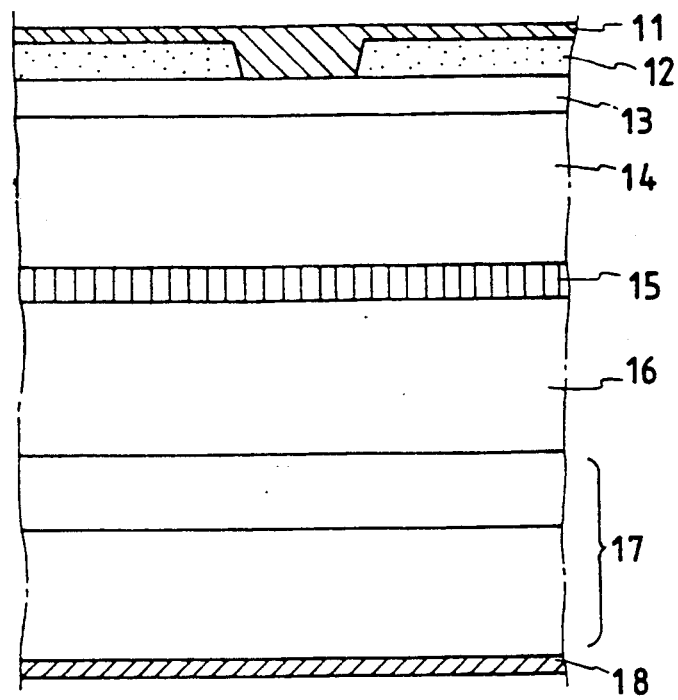
FIG. 4 is a partial cross-sectional view to show the construction of another semiconductor light-emitting device according to the first embodiment of the present invention.
Figure 5:
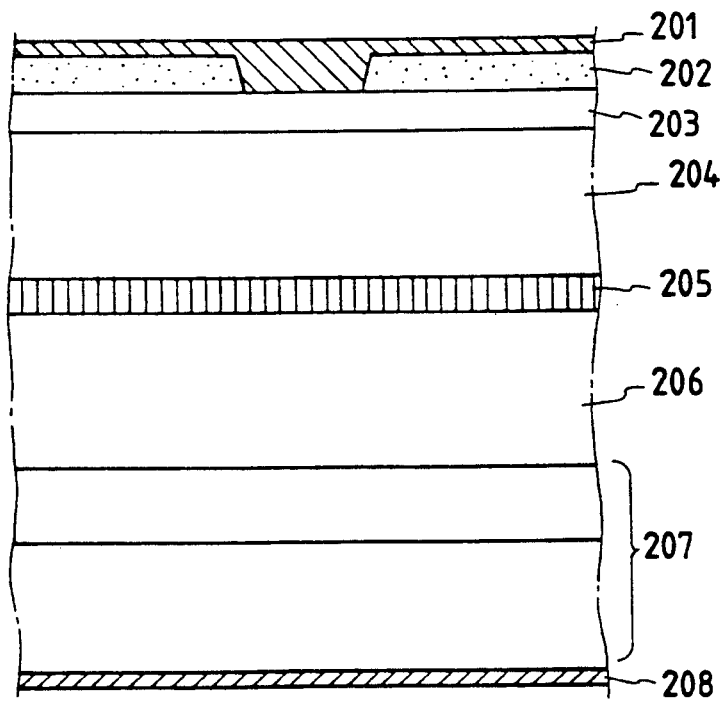
FIG. 5 is a partial cross-sectional view to show the construction of a semiconductor light-emitting device of the prior art.

FIG. 4 cross-sectionally illustrates the construction of another semiconductor laser according to the first embodiment of the present invention, having a double hetero(DH-)structure of an oxide film stripe type. In FIG. 4, the numeral 11 denotes a p-type electrode; 12, an insulating layer; 13, a p-GaAs ohmic contact layer; 14, a p-AlGaInP cladding layer; 15, an undoped GaInP active layer formed of $Ga_yIn_{1-y}P$ ($0.5 \leq y \leq 1$); 16, an n-AlGaInP cladding layer; 17, a GaAs substrate; and 18, an n-type electrode.

The above AlGaInP cladding layers 14 and 16 are so composed as to be lattice-matched to the GaAs substrate 17. The GaInP active layer 15 is so composed as to have strained lattice structure. To describe the GaInP active layer 15 in detail, the GaInP active layer 15 employs $Ga_yIn_{1-y}P$ ($0.5 \leq y \leq 1$), having a larger gallium component than the composition "$Ga_{0.5}In_{0.5}P$" lattice-matched to the GaAs substrate. Lattice mismatch ($\Delta a/a$) in this instance can be calculated according to the following expression:

$$\Delta a/a = (3.80 - 7.38y)/100$$

Band-gap energy (Eg) that determines the oscillation wavelength can also be calculated according to the following expression:

$$Eg\ (eV) = 1.351 + 0.643y + 0.786y^2$$

(wherein $y < 0.73$)
For example, when the $Ga_yIn_{1-y}P$ active layer 15 is so composed as to be $y = 0.73$, it follows that Eg is 2.24 eV, the oscillation wavelength is 0.55 μm, and the lattice mismatch is $-1.6 \times 10^{-2}$.

Since the semiconductor laser according to the present embodiment is constituted as described above, it is possible to obtain a small-sized semiconductor laser with an oscillation wavelength of 0.67 μm or less having a low threshold value. More specifically, in a semiconductor laser having an $In_xGa_{1-x}As$ cladding layer, a laser beam can be oscillated at a low threshold value even when the lattice mismatch to the GaAs substrate 17 is $2.1 \times 10^{-2}$ ($x = 0.3$). In the same way, in the case of the $Ga_yIn_{1-y}P$ active layer 5 in the semiconductor laser having the $(Al_xGa_{1-x})_yIn_{1-y}P$ cladding layer, a laser beam can be oscillated at a low threshold value when the y is within the range of $0.5 \leq y < 0.73$. If y is 0.73 or more, no laser beam can be emitted because of indirect transition.

As having been described above, according to the first embodiment of the present invention, it is possible to obtain a semiconductor light-emitting device having an oscillation wavelength of 0.67 or less because of the $Ga_yIn_{1-y}P$ active layer.

As having been described above, according to the first embodiment of the present invention, it is possible to obtain a semiconductor light-emitting device having an oscillation wavelength of 0.67 or less because of the $Ga_yIn_{1-y}P$ active layer containing no aluminum. In addition, because of the $Ga_yIn_{1-y}P$ active layer containing no aluminum, the active layer hardly undergoes oxidation even when it has a high operation temperature, so that the device may cause less deterioration of characteristics, can have a long lifetime, can be small in size and can obtain coherent light with a low power consumption.

According to the second embodiment of the present invention, it is possible to provide a semiconductor light-emitting device that can attain an oscillation wavelength of from 0.68 μm to 0.78 μm which has been difficult for conventional semiconductor lasers to attain, and at the same time can be small in size and can obtain coherent light with a low power consumption.

What is claimed is:

1. In a semiconductor light-emitting device, the improvement comprising:
    a substrate formed of GaAs;

a first cladding layer formed of $(Al_xGa_{1-x})_{0.5}In_{0.5}P$ ($0 \leq x \leq 1$) and layered on said substrate;

an active layer formed of $Ga_yIn_{1-y}P$ ($0.5 < y \leq 1$) and layered on said first cladding layer; and a second cladding layer formed of $(Al_xGa_{1-x})_{0.5}In_{0.5}P$ ($0 \leq x \leq 1$) and layered on said active layer; said first and second cladding layers being lattice-matched to said substrate, said active layer being lattice-mismatched to said substrate and at least one of said first and second cladding layers having a band-gap size larger by 0.25 eV than said active layer.

2. A semiconductor light-emitting device according to claim 1 wherein said device has an oscillation wavelength equal to or less than 0.67 μm.

3. A semiconductor light-emitting device according to claim 1, wherein said active layer is formed in such a way that the compositional proportion y in the composition $Ga_yIn_{1-y}P$ is periodically changed in the direction perpendicular to the surface of said substrate.

4. In a semiconductor light-emitting device, the improvement comprising;

a substrate formed of GaAs;

a first cladding layer formed of $(Al_xGa_{1-x})_{0.5}In_{0.5}P$ ($0 \leq x \leq 1$) and layered on said substrate;

an active layer formed of $Ga_yIn_{1-y}P$ ($0 \leq y < 0.5$) and layered on said first cladding layer; and a second cladding layer formed of $(Al_xGa_{1-x})_{0.5}In_{0.5}P$ ($0 \leq x \leq 1$) and layered on said active layer; said first and second cladding layers being lattice-matched to said substrate, said active layer being lattice-mismatched to said substrate and at least one of said first and second cladding layers having a band-gap size larger by 0.25 eV than said active layer.

5. A semiconductor light-emitting device according to claim 4, wherein said device has an oscillation wavelength of from 0.68 μm to 0.78 μm.

* * * * *